United States Patent [19]

Nishizawa et al.

[11] Patent Number: 4,651,015

[45] Date of Patent: Mar. 17, 1987

[54] SEMICONDUCTOR IMAGING DEVICE UTILIZING STATIC INDUCTION TRANSISTORS

[75] Inventors: Junichi Nishizawa, No. 6-16, Komegafukuro 1-chome, Sendai-shi, Miyagi; Takashige Tamamushi, Miyagi, both of Japan

[73] Assignee: Junichi Nishizawa, Miyagi, Japan

[21] Appl. No.: 561,242

[22] Filed: Dec. 13, 1983

[30] Foreign Application Priority Data

Dec. 13, 1982 [JP] Japan .............................. 57-218587

[51] Int. Cl.[4] ..................... H01L 27/14; H01L 29/80; H01L 31/00

[52] U.S. Cl. ................................ 250/578; 250/211 J; 358/213; 357/22; 357/30

[58] Field of Search ................ 250/578, 211 J, 211 R; 357/22, 30, 31, 32; 358/212, 213

[56] References Cited

U.S. PATENT DOCUMENTS

| | | | |
|---|---|---|---|
| 4,365,262 | 12/1982 | Nishizawa | 357/30 |
| 4,377,817 | 3/1983 | Nishizawa et al. | 357/30 |
| 4,468,682 | 8/1984 | Cogan | 357/22 |
| 4,518,863 | 5/1985 | Fukuoka et al. | 250/578 |
| 4,574,310 | 3/1986 | Nishizawa et al. | 250/578 |

Primary Examiner—Edward P. Westin
Attorney, Agent, or Firm—Sughrue, Mion, Zinn Macpeak & Seas

[57] ABSTRACT

A semiconductor imaging device having a wide dynamic range to provide optiumum output response characteristics under various illuminating conditions. The device includes a single SIT (Static Induction Transistor) which has a pair of principal electrode regions of one conduction type disposed facing one another through a channel region made of high resistivity semiconductor material. First and second gate regions of the other conduction type are formed in contact with the channel region to control the current flow between the two principal electrode regions. The second gate is common to all pixels. The potential at the second gate region is made variable by a variable power supply, a variable resistor connected between the second gate region and ground, a variable capacitor connected between the second gate region and ground, or combinations of these elements.

9 Claims, 15 Drawing Figures

SEMICONDUCTOR IMAGING DEVICE UTILIZING STATIC INDUCTION TRANSISTORS

BACKGROUND OF THE INVENTION

The present invention relates to a semiconductor imaging device. More particularly, the invention relates to a semiconductor imaging device composed of an array (one-dimensional arrangement) of pixels, each implemented with an SIT (Static Induction Transistor) having both light-detecting and switching capabilities.

The conventional semiconductor imaging device uses pixels having a separate light-detecting diode and switching transistor. With such a pixel, the output signal level and the device sensitivity are low. This low sensitivity of pixels puts a limit on the number of pixels that can be packed into the available area of the imaging device, hence limiting the resolution of the device.

The present inventors have previously disclosed semiconductor imaging devices that use an SIT as a light-detecting element. (See Japanese Patent Applications Nos. 204656/81 and 157693/82). In these devices, a light signal is stored in the gate region of the SIT, which has a high sensitivity to light, and a video signal is derived by controlling the current flowing between the source and drain according to the potential at the gate region. These devices are characterized by a high signal output.

One object of the present invention is to provide an improved semiconductor imaging device that produces a high signal output and whose output characteristics can be easily modified by purely electronic means.

Another object of the invention is to provide a semiconductor imaging device capable of producing optimum output characteristics irrespective of the imaged scene.

SUMMARY OF THE INVENTION

The above and other objects of the invention are met by a semiconductor imaging device which includes for each pixel a single SIT (Static Induction Transistor) which has a pair of principal electrode regions of one conduction type disposed facing one another through a channel region made of high resistivity semiconductor material. First and second gate regions of the other conduction type are formed in contact with the channel region to control the current flow between the two principal electrode regions. The second gate is common to all pixels. The potential at the second gate region is made variable by a variable power supply, a variable resistor connected between the second gate region and ground, a variable capacitor connected between the second gate region and ground, or combinations of these elements.

DESCRIPTION OF THE PREFERRED EMBODIMENTS

Figure 1:
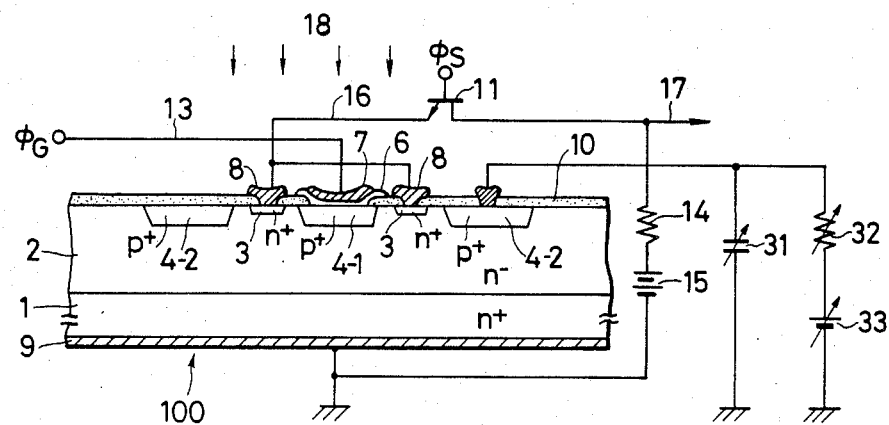
FIGS. 1, 2 and 12 show in cross section essential parts of three different embodiments of a pixel used in a semiconductor imaging device of the present invention.
Figure 2:
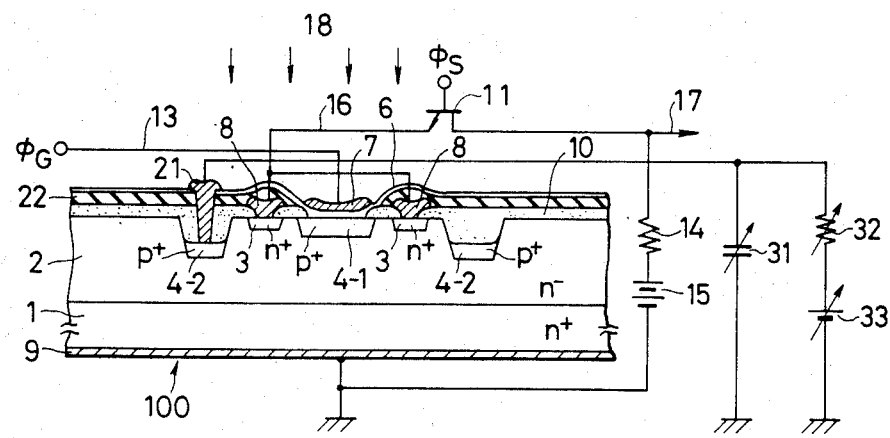

Two embodiments of a pixel that can be used in the semiconductor imaging device of the present invention are shown in cross section in FIGS. 1 and 2, wherein 1 is a Si substrate of the n+ type; 2 is a high resistivity semiconductor region of the n− (or intrinsic) type used to form a channel; 3 is a drain region of the n+ type having a high impurity concentration; 4-1 and 4-2 are control gate and shielding gate regions of the p+ type having a high impurity concentration and which are configured so that they do not completely cover the channel region; 6 is a insulating layer that forms a capacitor on the control gate region and which is typically made of $SiO_2$ or $Si_3N_4$, 7, 8 and 9 are, respectively, gate, drain and source electrodes with at least the gate electrode 7 being transparent to incident light 18; and 10 is a surface protective film typically made of $SiO_2$.

Other numerals and symbols have the following meanings: 11 is a switching transistor, $\phi_S$ is a transistor control signal, 13 is a selection line over which a reading pulse signal $\phi_G$ is applied to the gate electrode from a pixel selecting circuit (not shown), 14 is a load resistor, 15 is a video voltage source, 16 is a signal readout line, 17 is an output terminal, and 18 indicates incident light.

Gate region 4-1 of the p+ type provides a control gate in which photocarriers (holes in the embodiments shown) are accumulated and which is used to control the current flowing between the drain and source. The control gate is covered with a capacitor made of the insulating layer 6 and gate electrode 7. The other gate region 4-2 of the p+ type is a shielding gate which is configured to surround the control gate 4-1 and drain region 3 of the n+ type. The two gates 4-1 and 4-2 provide a potential barrier in the channel region 2. While only one pixel is shown in FIGS. 1 and 2, the shielding gate 4-2 has the function of isolating two adjacent pixels by a depletion layer.

The devices shown in FIGS. 1 and 2 also include a variable capacitor 31 connected between the shielding gate 4-2 and ground, as well as a variable resistor 32 and an adjustable power source 33 that are connected in parallel with the capacitor 31. By varying the values of these components, the output characteristics of the pixel can be controlled.

The pixel shown in FIG. 2 differs from the device shown in FIG. 1 in that the shielding gate 4-2 in the former pixel is buried within the silicon substrate. The shielding gate of this buried type can be fabricated by various methods, for example, by the LOCOS method wherein boron or other suitable impurity atoms are deeply diffused in the area of the substrate where the shielding gate is to be formed, and thereafter the surface of the diffused layer is subjected to selective oxidation, or a notching process wherein a notch is cut in the target area by, for example, plasma etching. Boron or other suitable impurity atoms are diffused into the notch. If desired, an oxide layer may be formed in the upper part of the notch. In FIG. 2, an insulating layer, typically made of phosphosilicate glass and which isolates the gate and drain electrodes 7 and 8, is indicated at 22, but this is omitted from FIG. 1 for the sake of clarity.

Figure 3:
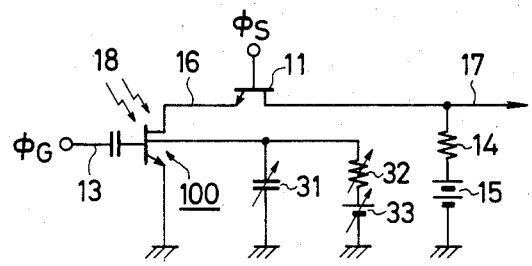
FIG. 3 is an equivalent circuit of the pixel shown in these Figures.

The equivalent circuit of the pixel shown in each of FIGS. 1 and 2 is illustrated in FIG. 3. Upon illumination with light 18, holes generated by light excitation flow into the gate region 4-1 of an SIT 100 to generate an optical signal. A pulse signal $\phi_S$ is applied to the base (or gate) of the switching transistor 11 to turn it on, whereupon the bias voltage is applied across the drain and source of the transistor 100 from the power supply 15. When a pulse of the signal $\phi_G$ is applied to the gate region 4-1, the transistor 100 turns on and drain current flows with a magnitude determined according to the intensity of the incident light 18. A light output signal is obtained at the output terminal 17. This optical output varies with the intensity of the incident light 18 and is characterized by a gain of more than $10^3$, which is at least ten times higher than the gain achieved by the conventional bipolar transistor device. As a further advantage, the output signal obtained has a wide dynamic range. The control gate 4-1 is connected to a capacitor that stores an optical signal while blocking the passage of the d.c. component of the signal.

In order to fabricate an SIT having the configuration described above, the concentration of impurities in the channel region 2 of the n$^-$ type should not exceed about $1 \times 10^{16}$ cm$^{-3}$, whereas the impurity concentration in each of the gates 4-1, 4-2, drain 3 and source 1 should exceed about $1 \times 10^{18}$ cm$^{-3}$. In order to prevent a drain current from flowing when the gate voltage is zero volts, the dimensions and impurity concentrations should be so selected that the diffusion potential above is sufficient to form a depletion layer between the two gates and in the channel. From a process view point, a configuration having thicker gate regions and a smaller inter-gate spacing is far easier to fabricate. Since the SIT is designed to achieve a high gain upon illumination with light, care must be taken so that no dislocation or other crystal defects are introduced into the device during fabrication. If boron is diffused to form a p$^+$ type gate, a suitable group IV element should also be diffused for the purpose of compensating for any lattice deformation that might occur. The channel region 2 of the n$^-$ type must present an environment where an electron-hole pair generated by light excitation has a long lifetime and will not easily recombine. To satisfy this requirement, a getter that traps heavy metals is preferably introduced into the channel in the final step of the fabrication process.

Figure 4:
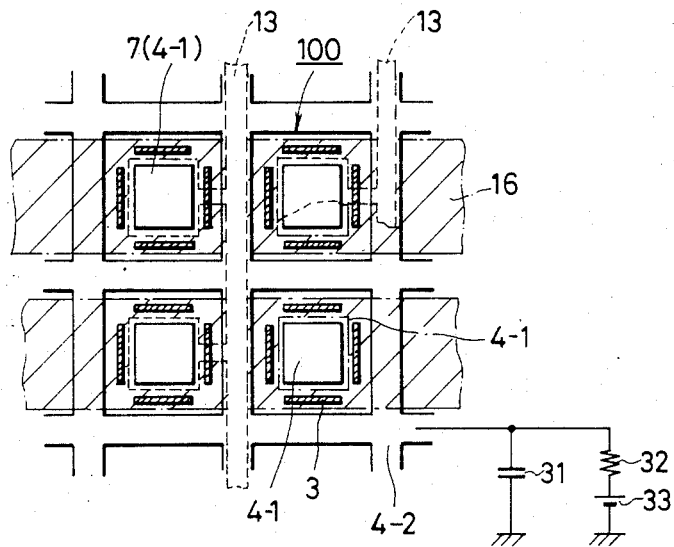
FIG. 4 is a plan view of pixels arranged in an array.

Pixel units shown in FIGS. 1 to 3 are arranged as shown in the plan view of FIG. 4, wherein each pixel, generally indicated at 100, includes the control gate 4-1 surrounded by the shielding gate 4-2 to define a channel region which has formed therein a drain region 3 providing one principal electrode for the pixel. With this arrangement, photocarriers stored in the control gate 4-1 cannot easily flow out of the control gate because of the drain 3 of the n$^+$ type that surrounds it. In other words, the drain region 3 serves as a barrier against the leakage of photocarriers. Therefore, when a pulse voltage is applied to the signal readout line 16 and selection line 13, a current will flow between the drain and source in a magnitude determined according to the amount of photocarriers stored in the control gate. An output is thus obtained in an amount that varies with the magnitude of the optical input.

The effectiveness of the drain region 3 as a barrier can be increased by increasing its length per unit pixel, consequently producing a higher level output current. Therefore, if the pixel is square in shape, the drain region is preferably provided on each of the four sides of the pixel. In this case, the four sides of the pixel may be completely surrounded by the drain region. However, the spacing between the control gate 4-1 and the shielding gate 4-2 at each corner of the pixel is greater than the spacing in other areas to permit an easier current flow between the drain and source. Therefore, the drain region 3 is preferably provided along the entire length of the pixel, except for the area where the two gate regions are spaced by a greater distance than in other areas. (If the pixel is square, the area to be excluded is each of the four corners.) In order to minimize the leakage current from the corners, it is preferred to form four drain regions which are slightly shorter than one side of the control gate and to dispose each of these drain regions within the length of one side of the control gate.

The shielding gate 4-2, together with the control gate 4-1, forms a potential barrier in the channel region. At the same time, the shielding gate provides electrical isolation between adjacent pixels. The shielding gate also has the function of preventing blooming by discharging excess photocarriers stored in the control gate 4-1 when it is illuminated with light in an amount exceeding the saturation level.

In order to accomplish these, the shielding gate 4-2 is formed around the control gate 4-1 with the drain region 3 interposed as shown in FIG. 4. The shielding gate is electrically common to pixels 100 arranged in an array. More specifically, in the embodiment of FIG. 4, the shielding gate 4-2 is common to every two adjacent pixels 100 and is formed surrounding the control gate 4-1. Therefore, in the embodiment shown, the size of one unit of pixel 100 is defined by the center lines of two adjacent shielding gates.

Figure 5:
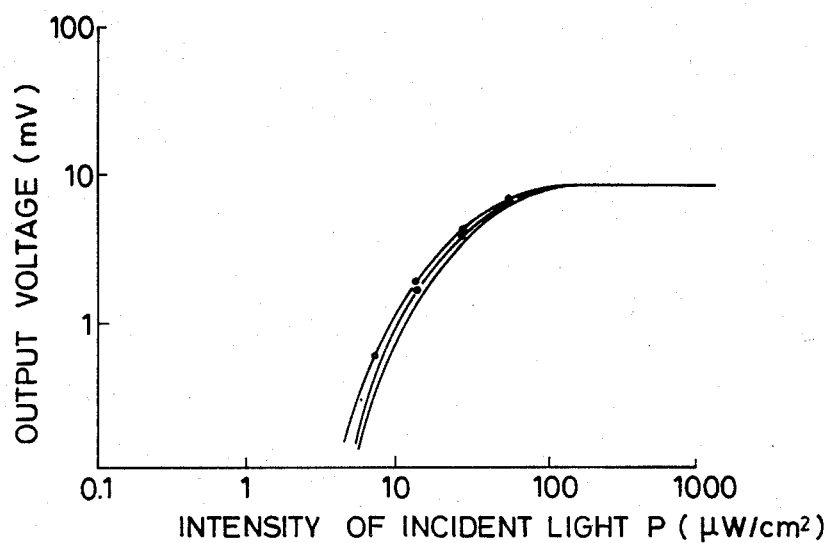
FIG. 5 is a graph showing a light intensity vs. output voltage characteristic of the pixel.
Figure 6:
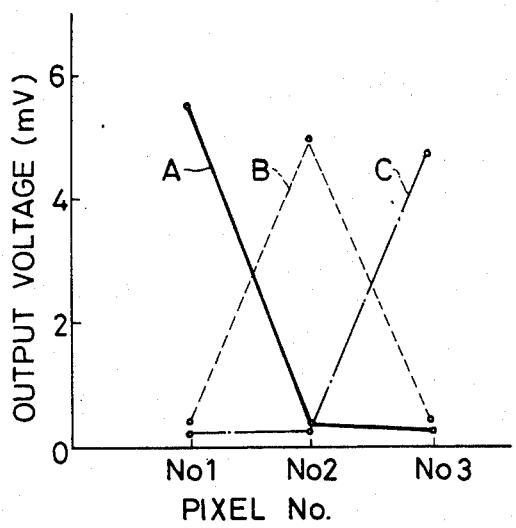
FIG. 6 is a graph comparing the light intensity vs. output voltage characteristics between a particular illuminated pixel and an adjacent unilluminated pixel.

The shielding gate 4-2, that is designed to be common to a plurality of pixels 100, ensures good isolation between pixels, as will be apparent from FIGS. 5 and 6. FIG. 5 is a graph showing a typical optical response characteristics of a semiconductor imaging device of the present invention. More specifically, FIG. 5 shows the relation between the intensity of incident light and output voltage obtained when a semiconductor imaging device composed of a plurality of pixels having the configuration shown in FIG. 1 is illuminated with light and supplied with the signals $\phi_S$ and $\phi_G$ to produce an output signal. The measurement was conducted for three adjacent pixels arranged in an array.

As is clear from FIG. 5, an increase in the intensity of incident light is accompanied by a corresponding increase in the output voltage. When the intensity of the incident light is about 100 microwatts/cm$^2$, the output voltage reaches the saturation point. These characteristics are obviously improved over those of the conventional MOS type semiconductor imaging device whose output is saturated with an exposure of only about 10 microwatts/cm$^2$.

FIG. 6 is a graph obtained by plotting the output voltages from three adjacent pixels each having the configuration shown in FIG. 1. In the test, the entire surface of each pixel was illuminated with light of an intensity less than the saturation value, however no adjacent pixel was illuminated when that specific pixel was under illumination. On the horizontal axis of the graph, the identification number of each pixel is indicated, line A represents the output voltage obtained when only the first pixel was illuminated with light, line B shows the output voltage obtained when only the second pixel was illuminated, and line C refers to the output voltage obtained when only the third pixel was illuminated. In the semiconductor imaging device of the present invention, the shielding gate 4-2 is common to a plurality of pixels, but since it is formed around the control gate 4-1 of each pixel, the depletion layer it creates provides electrical isolation between adjacent pixels. Therefore, as is clearly seen in FIG. 6, the device of the present invention achieves good signal separation between respective pixels.

In the experiment, the entire area of each pixel was exposed to light, and hence the channel region 2 of the n⁻ type underlying the shielding gate 4-2 was also illuminated. However, as can seen from FIG. 6, the resulting photocarriers were confined in the shielding gate of one pixel and they did not drift into the control gate 4-1 of the adjacent pixel. This is further evidence of the good signal separation between pixels attained by the invention.

Since any leaking carriers are absorbed in the shielding gate region, adjacent pixels are effectively isolated from each other. Obviously, this provides the semiconductor imaging device with an increased resistance to blooming. Since the shielding gate 4-2 surrounds the control gate 4-1 as shown in FIG. 4, excess photocarriers generated by intense light will be absorbed by the shielding gate without leaking into the adjacent pixel.

The measure for the resistance to blooming that is conventionally used with semiconductor imaging devices is the amount of light received by a particular pixel when 15% of the saturation current has leaked into the adjacent pixel. With the conventional MOS type semiconductor imaging device, the saturation exposure is 10 microwatts/cm$^2$, and about 20 times of that amount will produce a leakage current amounting to 15% of the saturation level. This means the index for the resistance to blooming of the conventional MOS type semiconductor imaging device is about 200 microwatts/cm$^2$ (10 microwatts/cm$^2 \times 20$). On the other hand, the saturation exposure for the pixels of the device of the present invention is about 100 microwatts/cm$^2$ (see FIG. 5), which is ten times as great as that for the MOS type semiconductor imaging device. Furthermore, the shielding gate 4-2 surrounds the control gate 4-1 and is common to a plurality of pixels. It was found experimentally that each pixel could receive an exposure far greater than a level 20 times the saturation exposure without causing blooming in the adjacent pixel. Therefore, in consideration of the high level of saturation current, it can be safely concluded that the semiconductor imaging device of the present invention has an index for resistance to blooming which is several decades higher than that of the conventional MOS type semiconductor imaging device.

Figure 7:
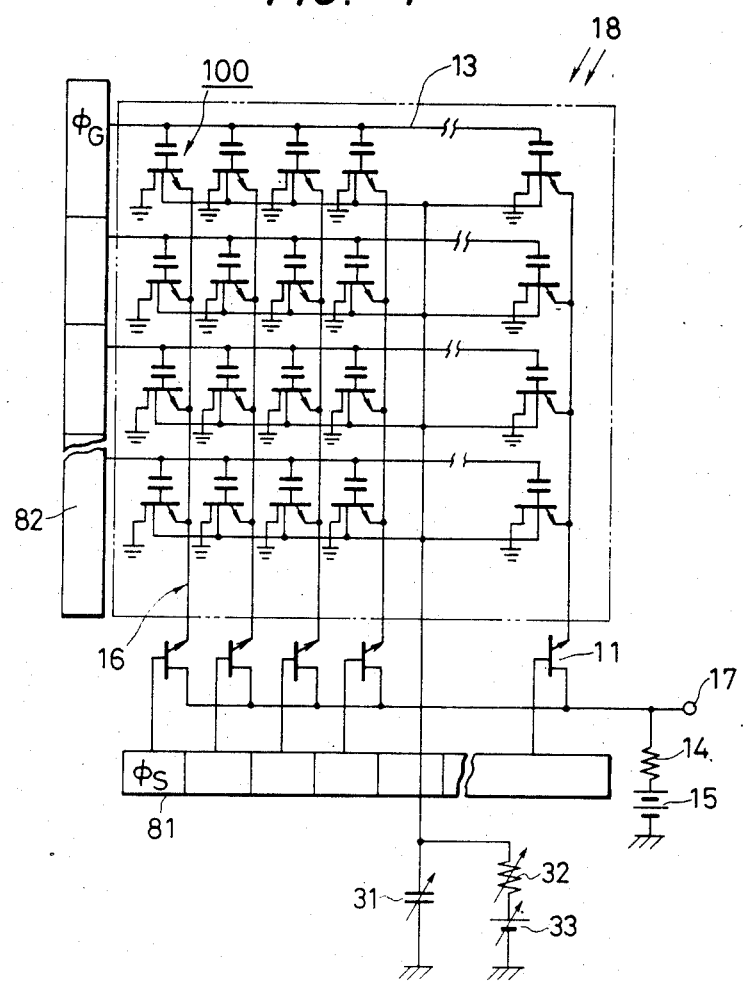
FIG. 7 is a circuit diagram of a semiconductor imaging device according to one preferred embodiment of the present invention.

A circuit diagram of a semiconductor imaging device formed by arranging the pixels of the present invention two dimensionally is shown in FIG. 7. In FIG. 7, 81 is a circuit for selecting among signal readout lines 16, and 82 is a circuit for selecting among selection lines 13. The circuit 81 selects sequentially one of the switching transistors 11 in response to pulses of a signal $\phi_S$ and causes the power source 15 to apply a bias voltage to the particular signal readout line 16 through the load resistor 14. The circuit 82 causes the pulse signal $\phi_G$ to be applied to the proper selection line 13. By sequential selection of the two-dimensionally arranged pixels 100, a two-dimensional video signal can be produced at the output terminal 17. Again, in the illustrated two dimensional semiconductor imaging device, the shielding gate is common to all pixels and forms, together with the control gate, a potential barrier in the channel region. Furthermore, the shielding gate isolates adjacent pixels by a depletion layer and ensures the effective isolation between the respective pixels.

As will be apparent from FIGS. 1 to 7, the shielding gate 4-2 combines with the control gate 4-1 to form a potential barrier in the channel region of each pixel 100. At the same time, the shielding gate is common to a plurality of pixels and is formed around the control gate 4-1. Therefore, it provides effective isolation between adjacent pixels. This shielding gate is grounded through a variable capacitor 31, as well as through the variable resistor 32 and adjustable power source 33. By properly adjusting the values of these components, the potential barrier in the channel region of each pixel 100 can be controlled so as to produce desired output characteristics.

Figures 8A, 8B:
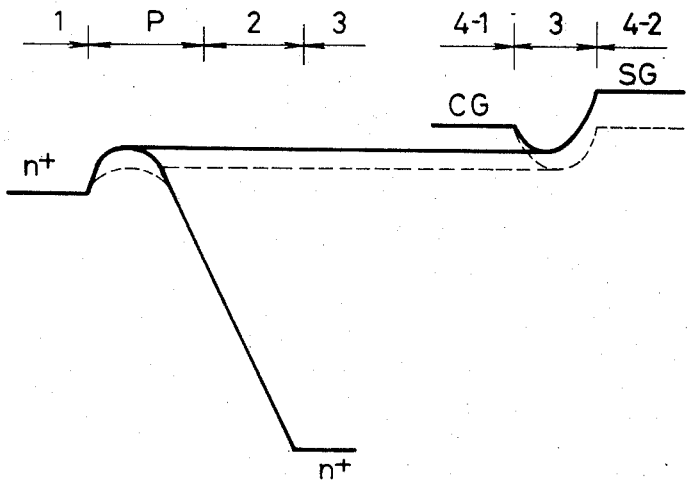
FIGS. 8A and 8B are an energy level diagram of a pixel used in the present invention.

FIGS. 8A and 8B are schematic representations of the potential distribution in each pixel, wherein reference numerals and symbols the same as those used in FIGS. 1 to 7 identify the same components. FIG. 8A shows the potential distribution between the drain and source of each pixel, and FIG. 8B represents the potential distribution in the direction that transverses the control and shielding gates and which includes the true gate (i.e. the area providing the true potential barrier to the current flow between the drain and source). The symbol P in FIG. 8A indicates the position of the true barrier. FIGS. 8A and 8B assume the application of a positive voltage to the drain electrode. Only one of the two energy bands, the conduction band or valence band, is shown in the energy level diagram of FIGS. 8A and 8B.

As is clear from FIGS. 8A and 8B, when the shielding gate 4-2 is negatively biased, the potential of the area corresponding to the sheilding gate 4-2, indicated by the dashed line, rises to the level indicated by the solid line. As a result, the potential of the area P also rises. Even if a gate pulse is applied to the control gate region containing a small number of photocarriers generated upon illumination with dim light, there is little likelihood that current will flow between the drain and source. Obviously, the reverse phenomenon will occur if the shielding gate is positively biased.

It is therefore concluded that by changing the voltage of the power source shown 33 in FIGS. 1 to 4 and 7, the amount the output voltage with respect to changes in the intensity of incident light, termed the "gamma" of the output voltage with respect to light intensity, can be varied.

The present inventors have measured the ratio of output voltage to light intensity by switching the voltage from the power source 33 between −5 and −2 volts while the capacitance 31 and resistance 32 were held constant. The results were 0.96 at −5 V and 0.50 at −2 V. Apparently, the value of gamma depends on the bias voltage applied to the shielding gate. Therefore, desired values of gamma can be obtained by adjusting the power source 33.

Figure 9:
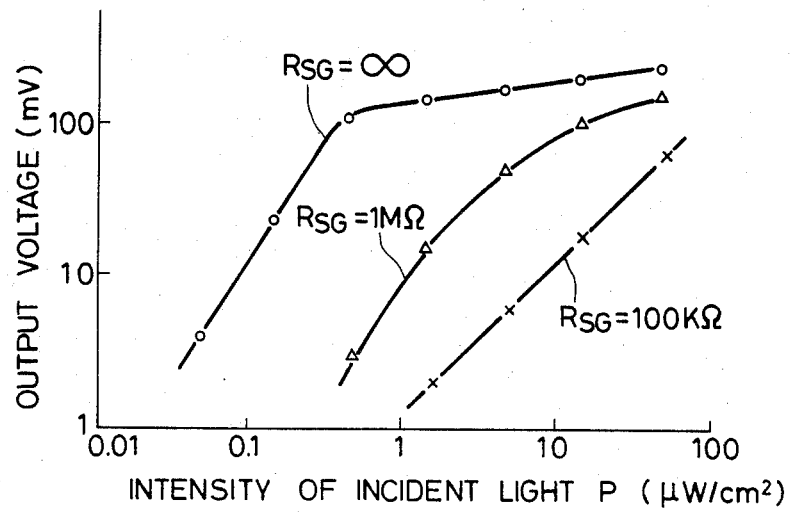
FIGS. 9 and 10 are graphs showing the light intensity vs. output voltage characteristics of the imaging device for the different values of resistance (FIG. 9) and capacitance (FIG. 10)
Figure 10:
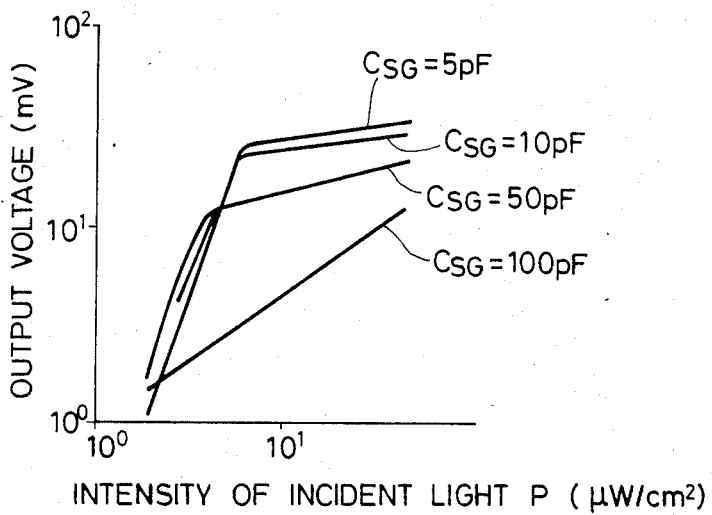

FIG. 9 shows a family of light intensity vs. output current curves for three different settings of the variable resistor 32 shown in FIGS. 1 to 4 and 7. FIG. 10 shows a family of light intensity vs. output current curves for four different settings of the variable capacitor 31 also shown in FIGS. 1 to 4 and 7. In obtaining the data of FIG. 9, the capacitor 31 and power source 33 were fixed to constant values. In obtaining the data of FIG. 10, the resistor 32 and the output of the power source 33 were held at constant values.

FIG. 9 shows that as the resistance is increased, the response to weaker light is improved. Therefore, the best picture quality can be obtained irrespective of the intensity of incident light by adjusting the resistor 33 according to the imaged scene. FIG. 10 shows that as the capacitance is increased, the dynamic range is expanded. Therefore, a desired dynamic range can be obtained by properly controlling the capacitor 31.

These changes in the response to incident light as realized by adjustment of capacitor 31, resistor 32 and power source 33 depend on the change in the potential at the shielding gate region as caused either by external electrical means affecting the shielding gate or by the mechanism of the photocarriers that are generated by the incident light and which enter the shielding gate. Therefore, the three components, the capacitor 31, the resistor 32 and the power source 33, collectively can be used for regulating the potential at the shielding gate.

If desired, all three elements can be adjusted to obtain the best results according to the specific imaged scene. Alternatively, only one or two of these elements may be used. For example, only the adjustable power source 33 may be connected between the shielding gate and ground, or it may be replaced by either the variable capacitor 31 or the variable resistor 32 alone. If desired, one or two of the three elements may be fixed while the remaining element(s) is made variable. For example, the line grounding the shielding gate 4-2 through variable capacitor 31 may be removed, or the capacitor 31 fixed and the shielding gate grounded through the variable resistor 32 and the adjustable power source 33 connected. In still another modification, the variable resistor 32 may be an active device such as an MOS transistor.

Figure 11A:
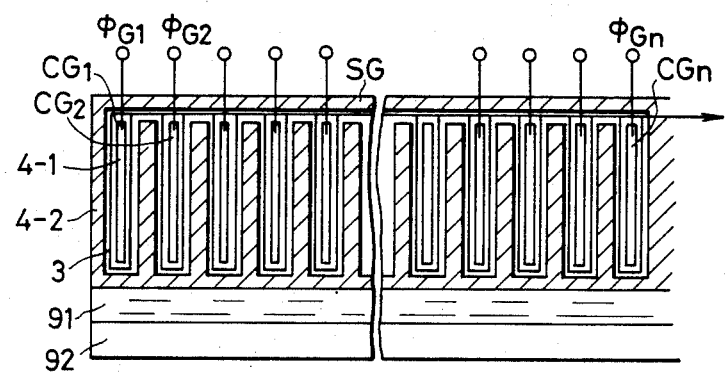
FIGS. 11A and 11B are, respectively, a plan view and a circuit diagram of another embodiment of an imaging device of the present invention.
Figure 11B:
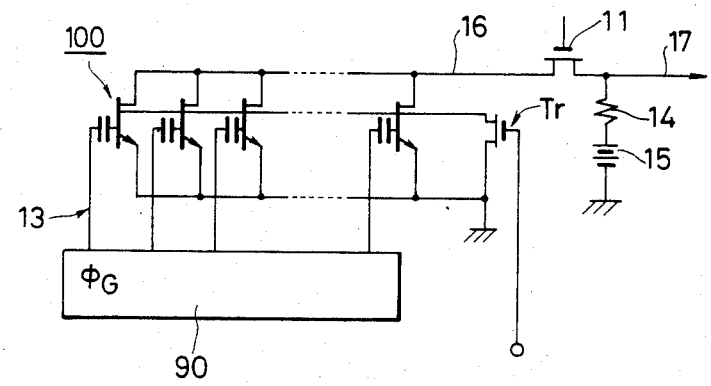

FIG. 11A is a plan view of the semiconductor imaging device of the present invention, wherein pixels are arranged one dimensionally. FIG. 11B is an equivalent circuit diagram of this line sensor. Again, the drain, source 1 and shielding gate 4-2 are common to all pixels, and the control gate 4-1 is the only electrical discrete element for each pixel 100. The control gates are connected to respective capacitors (FIG. 11B) which are sequentially selected by the selection circuit 90 by the pulse signal $\phi_G$.

One important feature of the illustrated embodiment is that a MOS transistor $TR_1$ having the shielding gate 4-2 as a drain (the gate electrode is indicated at 91 and the source at 92) is provided along the length of the line sensor. This resistor performs as an active device and clears the shielding gate region of residual carriers, left after the reading of the video signal, in a direction perpendicular to the longitudinal axis of the line sensor.

Figure 12:
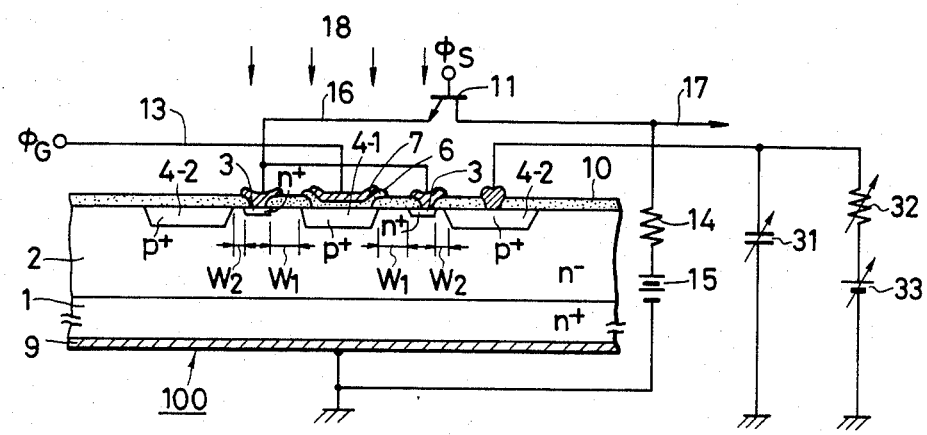

FIG. 12 shows another modification of the unit pixel used in the semiconductor imaging device of the present invention. The drain region 3 is positioned in such a manner that the distance $W_2$ from the shielding gate region 4-2 is smaller than the distance $W_1$ from the control gate region 4-1. Because of this potential relationship ($W_1$ greater than $W_2$), the depletion layer created by the control gate region is sufficiently expanded to ensure effective storage of photocarriers in the control gate region.

Figure 13:
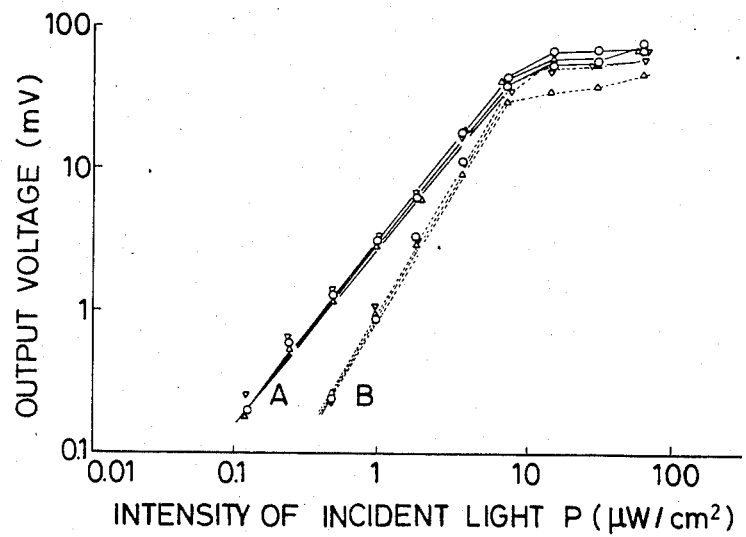
FIGS. 13 is a graph showing a light intensity vs. output voltage characteristic of the pixel shown in FIG. 12.

FIG. 13 shows light intensity vs. output voltage curves for two different relations between $W_1$ and $W_2$. Curve A corresponds to $W_1 - W_2 = 2$ microns and curve B to $W_1 - W_2 = 1$ micron. As is clear from the graph of FIG. 13, when the drain region 3 comes adequately close to the shielding gate 4-2, photocarriers are effectively stored in the control gate 4-1.

According to still another modification of the pixel of the present invention, the depth of impurity diffusion or the impurity concentration in the shielding gate is varied with respect to the control gate. Details of a technique for doing this are found in Japanese Patent Application No. 157693/82 filed in the name of the present inventors.

The relation between the drain region 3 and source region 1 in the foregoing embodiments may be reversed and bias may be applied from the power source 15 to an $n^+$ type substrate 1 through the load resistor 14. If desired, the conduction types of the respective regions of the semiconductor imaging device may be reversed. In that case, a negative rather than positive voltage must be applied to the selection line 13 and signal readout line 16, and electrons rather than holes are stored in the control gate region 4-1.

As described in detail above, the semiconductor imaging device of the present invention includes a one-dimensional (linear) or two-dimensional (matrix) arrangement of pixels, with each pixel being constituted by a single SIT having drain and source regions, as well as control gate and shielding gate regions. The device is characterized by a simple structure wherein one pixel consists of one transistor and yet is capable of producing an output signal having a wide frequency response. Furthermore, the device is provided with means for regulating the potential at the shielding gate, and hence is capable of producing any desired photoresponse characteristic. By properly combining a variable resistor, variable capacitor and adjustable power source as gate potential regulating means, any practical desired value of gamma, optimum intensity of incident light and dynamic range can be selected so as to achieve the best imaging results.

We claim:

1. A semiconductor imaging device comprising; an array of pixels, each comprising a static induction transistor which comprises a substrate constituting a source and having a source electrode connected thereto; a pair of principal electrode regions of one conduction type together constituting a drain and disposed facing each other through a channel region made of high resistivity semiconductor material; first and second gate regions of the other conduction type disposed so as to be in contact with said channel region for controlling current flow between said two principal electrode regions; an insulating layer constituting a capacitor and disposed on at least part of said first gate region; carriers generated by light excitation being stored in said first gate regions, said second gate region being electrically common to every two adjacent ones of said pixels; and means for regulating the potential at the second gate region differently from said first gate region.

2. The device according to claim 1 wherein said gate potential regulating means comprises an adjustable power source for applying a voltage to said second gate region.

3. The device according to claim 1, wherein said gate potential regulating means comprises a variable resistor connected between said second gate region and ground.

4. The device according to claim 1, wherein said gate potential regulating means comprises a resistor and a power source connected between said second gate region and ground, at least one of said resistor and power source being variable.

5. The device according to claim 1, wherein said gate potential regulating means comprises a variable capacitor connected between said second gate region and ground.

6. The device according to claim 1, wherein said gate potential regulating means comprises a variable resistance and an adjustable power source connected between said second gate region and ground, and a variable capacitor connected between said second gate region and ground.

7. The device according to claim 3, wherein said variable resistor comprises an active device.

8. The device according to claim 4, wherein said variable resistor comprises an active device.

9. The device according to claim 6, wherein said variable resistor comprises an active device.

* * * * *